(12) United States Patent
Jang

(10) Patent No.: US 12,364,098 B2
(45) Date of Patent: Jul. 15, 2025

(54) DISPLAY DEVICE

(71) Applicant: Samsung Display Co., Ltd., Yongin-si (KR)

(72) Inventor: Minsok Jang, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/867,887

(22) Filed: Jul. 19, 2022

(65) Prior Publication Data

US 2023/0102213 A1 Mar. 30, 2023

(30) Foreign Application Priority Data

Sep. 29, 2021 (KR) .................. 10-2021-0129288

(51) Int. Cl.
| | | |
|---|---|---|
| *H10K 50/86* | (2023.01) | |
| *G02F 1/1333* | (2006.01) | |
| *G02F 1/1339* | (2006.01) | |
| *G02F 1/1343* | (2006.01) | |
| *H10K 59/12* | (2023.01) | |
| *H10K 59/38* | (2023.01) | |
| *H10K 59/40* | (2023.01) | |
| *H10K 59/50* | (2023.01) | |
| *H10K 77/10* | (2023.01) | |
| *H10K 102/00* | (2023.01) | |

(52) U.S. Cl.
CPC ....... *H10K 50/86* (2023.02); *G02F 1/133305* (2013.01); *G02F 1/13394* (2013.01); *G02F 1/13396* (2021.01); *G02F 1/13439* (2013.01); *H10K 50/865* (2023.02); *H10K 59/12* (2023.02); *H10K 59/38* (2023.02); *H10K 59/40* (2023.02); *H10K 59/50* (2023.02); *H10K 77/111* (2023.02); *G02F 2201/38* (2013.01); *G02F 2201/50* (2013.01); *H10K 2102/311* (2023.02)

(58) Field of Classification Search
CPC ........... G02F 1/133305; G02F 1/13394; G02F 1/13396; G02F 1/136209; G09F 9/301; H10K 77/111; H10K 2102/311; H10K 59/50; H10K 59/12; H10K 59/40; H10K 50/86; H10K 50/865; G06F 1/1652; G06F 2203/04102; H01L 27/3232; H01L 27/3225
See application file for complete search history.

(56) References Cited

U.S. PATENT DOCUMENTS 10,797,251 B2 10/2020 Kwon et al.
2015/0192951 A1* 7/2015 Chong .............. G02F 1/133305
359/894

(Continued)

FOREIGN PATENT DOCUMENTS

| KR | 20150081931 A | 7/2015 |
|---|---|---|
| KR | 20160067018 A | 6/2016 |

(Continued)

*Primary Examiner* — Jia X Pan
(74) *Attorney, Agent, or Firm* — CANTOR COLBURN LLP

(57) ABSTRACT

A display device includes a display panel having a light-emitting region, an anti-reflection layer on the display panel, an impact protection layer on the anti-reflection layer and including a plurality of spacers, and a first window on the impact protection layer.

20 Claims, 13 Drawing Sheets

(56) References Cited

U.S. PATENT DOCUMENTS

| | | | | |
|---|---|---|---|---|
| 2016/0116781 A1* | 4/2016 | Wu | ................... | G02F 1/13338 |
| | | | | 445/24 |
| 2016/0154259 A1* | 6/2016 | Kim | ................... | H10K 50/85 |
| | | | | 349/33 |
| 2019/0285926 A1* | 9/2019 | Lai | ................... | G02F 1/13394 |
| 2020/0144550 A1* | 5/2020 | Lee | ................... | G06F 3/0412 |
| 2021/0111373 A1* | 4/2021 | Park | ................... | H10K 50/844 |
| 2021/0200365 A1* | 7/2021 | Lee | ................... | H10K 50/865 |
| 2021/0273021 A1* | 9/2021 | Lee | ................... | H10K 50/865 |

FOREIGN PATENT DOCUMENTS

| | | |
|---|---|---|
| KR | 1020190094263 A | 8/2019 |
| KR | 20200051883 A | 5/2020 |
| KR | 102165889 B1 | 10/2020 |

\* cited by examiner

FIG. 1B
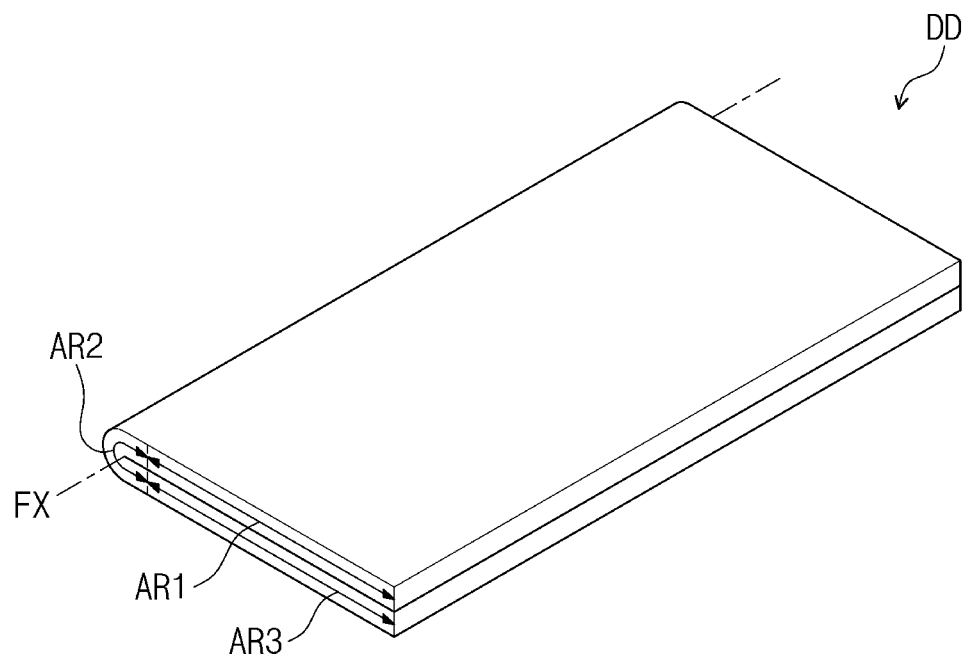
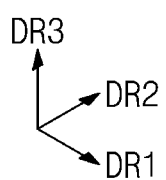

FIG. 11
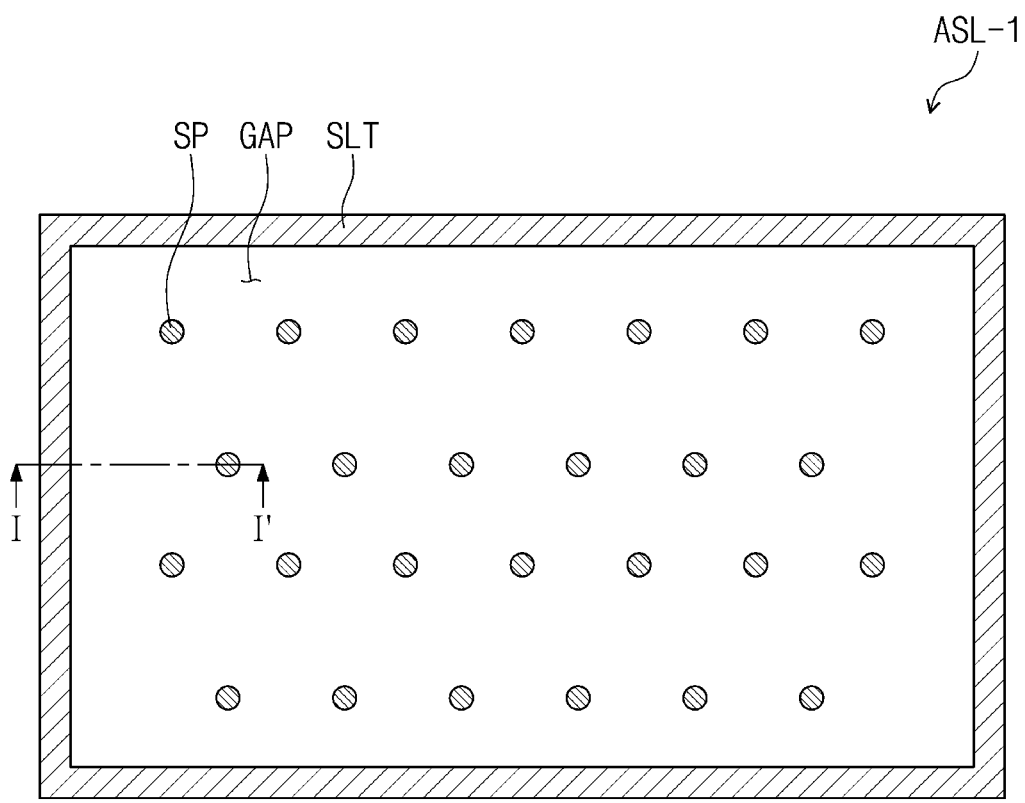
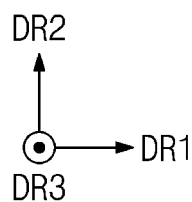

DISPLAY DEVICE

This application claims priority to Korean Patent Application No. 10-2021-0129288, filed on Sep. 29, 2021, and all the benefits accruing therefrom under 35 U.S.C. § 119, the entire contents of which are hereby incorporated by reference.

BACKGROUND

(1) Field

The present disclosure herein relates to a display device, and more particularly, to a display device having an improved reliability against an impact.

(2) Description of the Related Art

Display devices provide information by displaying various images on a display screen. In general, display devices display information within a display screen. Flexible display devices including a foldable flexible display panel have been developed. Unlike rigid display devices, flexible display devices may be folded, rolled, or bent. Flexible display devices, which may be various changed in shape, may be transported regardless of the size of the display screen, and thus a convenience of using the display devices may be improved.

SUMMARY

The present disclosure provides a display device having an improved reliability against an impact.

An embodiment provides a display device including a display panel having a light-emitting region defined therein, an anti-reflection layer on the display panel, an impact protection layer on the anti-reflection layer and including a plurality of spacers, and a first window on the impact protection layer.

In an embodiment, the plurality of spacers may include a plurality of first spacers each having a first height, and a plurality of second spacers each having a second height lower than the first height.

In an embodiment, a first region, a second region adjacent to the first region and folded, and a third region adjacent to the second region, may be defined along a first direction.

In an embodiment, the plurality of first spacers may be in the second region, and the plurality of second spacers may be in the first region and the third region.

In an embodiment, the plurality of second spacers may be in the second region, and the plurality of first spacers may be in the first region and the third region.

In an embodiment, the plurality of first spacers and the plurality of second spacers may be in the first region, the second region, and the third region.

In an embodiment, the plurality of first spacers and the plurality of second spacers may be alternately arranged one by one, in the first to third regions.

In an embodiment, the anti-reflection layer may include a color filter corresponding to a light-emitting region, and a black matrix adjacent to the color filter.

In an embodiment, the plurality of spacers may correspond to the black matrix.

In an embodiment, the plurality of spacers may be transparent.

In an embodiment, the plurality of spacers may include an elastic material.

In an embodiment, the impact protection layer may further include a gas filled into a space between the plurality of spacers.

In an embodiment, the impact protection layer may further include a liquid crystal filled into a space between the plurality of spacers.

In an embodiment, the impact protection layer may further include a first liquid crystal electrode between the anti-reflection layer and the liquid crystal, and between the anti-reflection layer and the plurality of spacers, and a second liquid crystal electrode between the liquid crystal and the first window, and between the plurality of spacers and the first window. An arrangement direction of the liquid crystal may be changeable by an electric field formed between the first liquid crystal electrode and the second liquid crystal electrode.

In an embodiment, the display device may further include a second window between the anti-reflection layer and the impact protection layer.

In an embodiment, the anti-reflection layer may further include a color filter corresponding to the light-emitting region, and an overcoat layer which covers a black matrix which is adjacent to the color filter. The plurality of spacers may be in direct contact with the overcoat layer.

In an embodiment, the display device may further include an overcoat layer under the first window.

In an embodiment, a display device includes a display panel in which a plurality of light-emitting regions are defined; an anti-reflection layer on the display panel and including a black matrix that does not overlap the plurality of light-emitting regions, a window on the anti-reflection layer, and a plurality of spacers between the window and the anti-reflection layer and overlapping the black matrix.

In an embodiment, the plurality of spacers may be spaced apart from each other, and air may be filled between the plurality of spacers.

In an embodiment, the display device may further include a liquid crystal between the window and the anti-reflection layer, and between the plurality of spacers.

BRIEF DESCRIPTION OF THE FIGURES

The accompanying drawings are included to provide a further understanding of the invention, and are incorporated in and constitute a part of this specification. The drawings illustrate embodiments and, together with the description, serve to explain principles of the invention. In the drawings:

FIG. 1B is a perspective view of a display device according to an embodiment;

FIG. 11 is a plan view of an impact protection layer according to an embodiment;

DETAILED DESCRIPTION

Figure 1A:
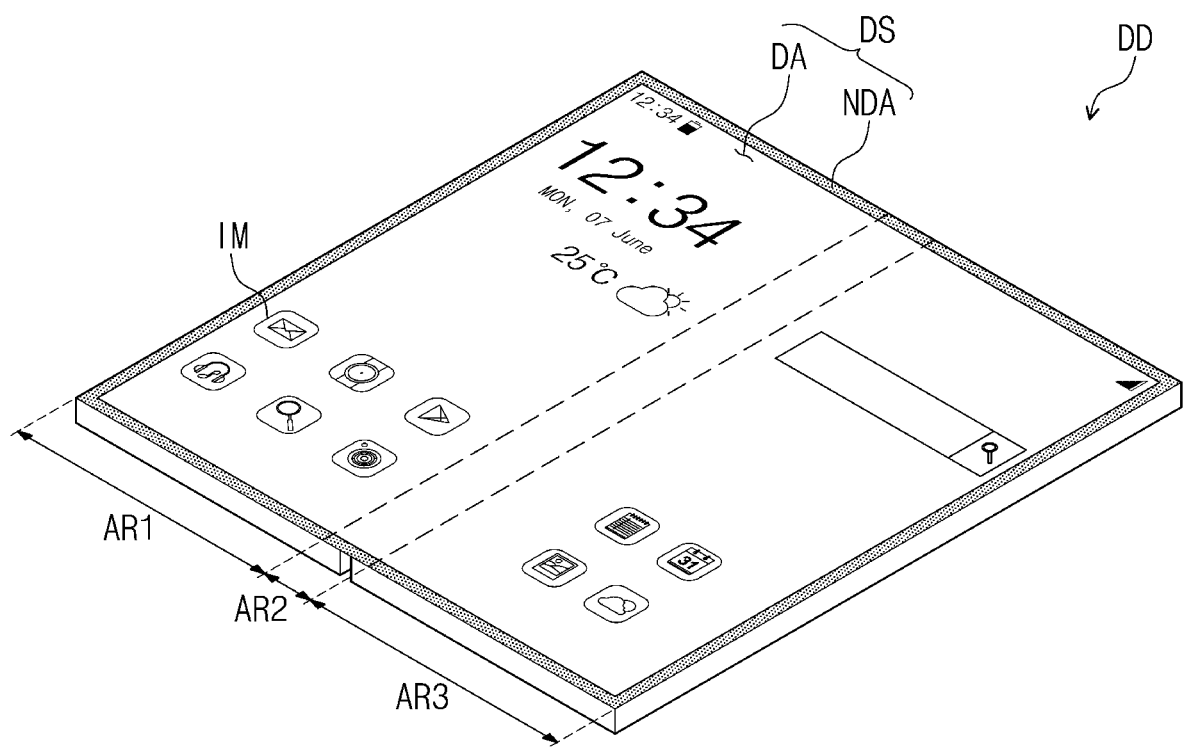
FIG. 1A is a perspective view of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being related to another element such as being "on", "connected to" or "coupled to" another element or layer, it can be directly on, connected or coupled to the other element or layer or intervening elements or layers may be present. In contrast, when an element is referred to as being related to another element such as being "directly on," "directly connected to" or "directly coupled to" another element or layer, there are no intervening elements or layers present.

Like reference numerals or symbols refer to like elements throughout. The thickness and the ratio and the dimension of the element are exaggerated for effective description of the technical contents.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described with reference to the accompanying drawings.

FIGS. 1A and 1B are perspective views of a display device DD according to an embodiment. FIG. 1A illustrates a spread state (or an unfolded state) of the display device DD, and FIG. 1B illustrates a folded state of the display device DD.

Referring to FIGS. 1A and 1B, the display device DD according to an embodiment may include a display surface DS defined by or parallel to a plane defined by the first direction DR1 and the second direction DR2 which crosses the first direction DR1. The display device DD may provide an image IM to outside the display device DD, through the display surface DS.

The display surface DS may include a display region DA and a non-display region NDA which is adjacent to the display region DA. In an embodiment, the non-display region NDA is around the display region DA. The display region DA may display the image IM, and the non-display region NDA may not display the image IM. The display region DA may include a plurality of pixels for displaying the image IM. The non-display region NDA may surround the display region DA. However, embodiments are not limited thereto, and a shape (e.g., planar shape) of the display region DA and the shape of the non-display region NDA may be changed.

Hereinafter, a direction substantially perpendicular to a plane defined by the first direction DR1 and the second direction DR2, is defined as a third direction DR3 or a thickness direction. In addition, in the present specification, "on a plane" may be defined as a view along the third direction DR3.

The display device DD may include a first region AR1, a second region AR2, and a third region AR3. The first region AR1, the second region AR2, and the third region AR3 may be sequentially arranged (e.g., in order) along the first direction DR1. The image IM may be displayed at each of the first region AR1, the second region AR2, and the third region AR3, without being limited thereto.

The second region AR2 may be referred to as a foldable region at which the display device DD is foldable, and the first and third regions AR1 and AR3 may be referred to as non-foldable regions which unfoldable or which remain flat even in the display device DD which is folded. Various components or layers of the display device DD may include the display region DA, the non-display region NDA, the first region AR1, the second region AR2 and/or the third region AR3 described above for the display device DD.

As illustrated in FIG. 1B, the second region AR2 may be folded with respect to a folding axis FX parallel to the second direction DR2. The display device DD which is folded at the second region AR2 has a curvature and a radius of curvature at the second region AR2. The display device DD which is folded disposes portions of first region AR1 and the third region AR3 may face each other along the thickness direction. Referring to FIG. 1B, the display device DD may be in-folded so that portions of the display surface DS face each other and are not exposed to the outside.

In an embodiment, the display device DD may be out-folded so that portions of the display surface DS face outward to be exposed to outside the display device DD. In an embodiment, the display device DD may be configured such that an in-folding operation or an out-folding operation is repeatable from an unfolding operation, but is not limited thereto. In an embodiment, the display device DD may be configured to be unfoldable, infoldable and/or outfoldable from among an unfolding operation, an in-folding operation, and an out-folding operation.

FIGS. 1A and 1B illustrate a foldable display device DD as an example of the display device DD, but the shape and type of the display device DD are not particularly limited thereto. In an embodiment, for example, the display device DD may be flexible or rigid.

Figure 2:
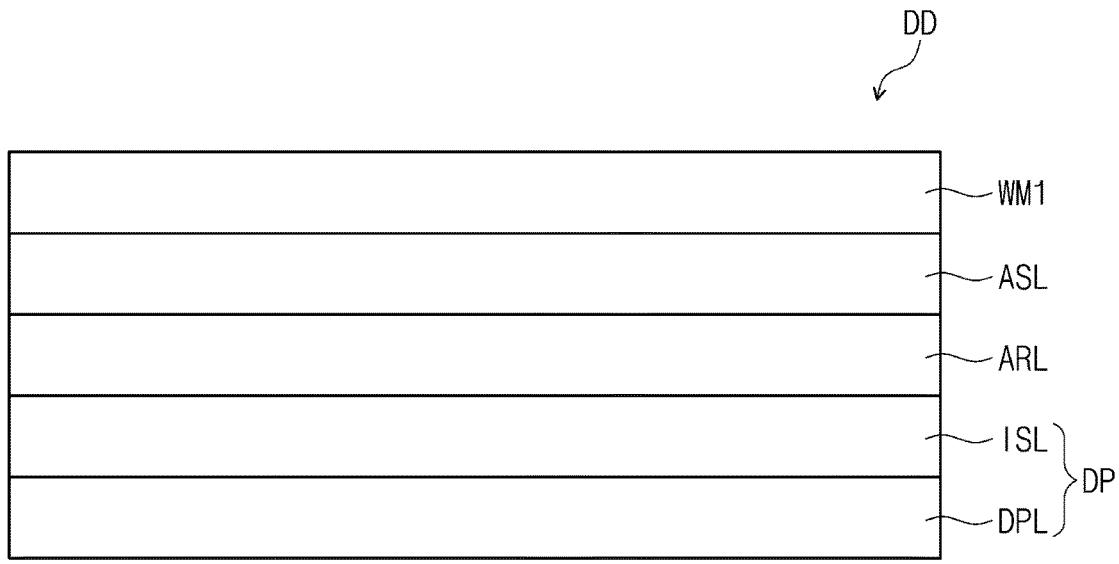
FIG. 2 is a diagram schematically illustrating a display device according to an embodiment of the inventive concept.

FIG. 2 is a diagram schematically illustrating a display device DD according to an embodiment.

Referring to FIG. 2, the display device DD may include a display panel DP, an anti-reflection layer ARL, an impact protection layer ASL, and a first window WM1. The display panel DP may include a display layer DPL and an input sensor layer ISL.

The display layer DPL may be a light-emitting display layer. In an embodiment, for example, the display layer DPL may be an organic light-emitting display layer, an inorganic light-emitting display layer, an organic-inorganic light-emitting display layer, a micro light-emitting diode (LED) display layer, or a nano LED display layer.

The input sensor layer ISL may be disposed on the display layer DPL. The input sensor layer ISL may sense an external input applied from outside thereof and/or from outside the display device DD. The external input may be provided from an input tool. The external input may include various types of external inputs, such as contact, proximity, light, heat, or pressure, and the input tool may include various types of objects such as a body part, a pen, etc.

The input sensor layer ISL may be formed (or provided) on the display layer DPL, such as through a continuous process. In this case, the input sensor layer ISL may be directly disposed on the display layer DPL. In this specification, the wording "component A is disposed directly on component B" may mean that a third component is not disposed between components A and B, an interface is formed between the components, etc. In an embodiment, for example, an adhesive layer may not be disposed between the input sensor layer ISL and the display layer DPL.

The anti-reflection layer ARL may be disposed on the input sensor layer ISL. The anti-reflection layer ARL may reduce the reflectance of external light. The anti-reflection layer ARL may be directly disposed on the input sensor layer ISL, such as through a continuous process.

The anti-reflection layer ARL may include a light shielding pattern 310 overlapping a reflection structure which is disposed under the anti-reflection layer ARL. The anti-reflection layer ARL may further include a color filter 320 overlapping a light-emitting region LA to be described later. The color filter 320 may include a first color filter, a second color filter, and a third color filter respectively corresponding to a first color pixel, a second color pixel, and a third color pixel. A detailed description of the anti-reflection layer ARL will be described later.

The impact protection layer ASL may be disposed on the anti-reflection layer ARL. When the display device DD receives an impact, such as from collision with a floor or other object, the impact protection layer ASL may reduce the impact applied to the display panel DP, and thus, the impact applied to the display panel DP may be reduced or eliminated. Accordingly, a bright spot defect of the display panel DP caused by the impact may be reduced or eliminated.

The impact protection layer ASL may include a plurality of spacers SP (see FIG. 6), and a material may be filled in an interspace GAP (see FIG. 6), which is a space between the plurality of spacers SP. The material (e.g., filling material MT) may be gas, air, or liquid crystal, but is not particularly limited thereto. A detailed description of the impact protection layer ASL will be described later.

The first window WM1 may be disposed on the impact protection layer ASL. The first window WM1 and the impact protection layer ASL may be bonded to each other by an adhesive layer. The adhesive layer may be a pressure sensitive adhesive film (PSA) or an optically clear adhesive member (OCA).

The first window WM1 includes at least one base layer member. The base layer member may be a glass substrate or a synthetic resin film. The first window WM1 may have a multilayer structure. The first window WM1 may include a thin-film glass substrate and a synthetic resin film which is disposed on the thin-film glass substrate. The thin-film glass substrate and the synthetic resin film may be bonded to each other by an adhesive layer, and the adhesive layer and the synthetic resin film may be removably attached to the thin-film glass substrate so as to be separated from the thin-film glass substrate for replacement thereof.

In an embodiment, the adhesive layer may be omitted, and the first window WM1 may be directly disposed on the impact protection layer ASL. The impact protection layer ASL may be coated with an organic material, an inorganic material, or a ceramic material.

Figure 3:
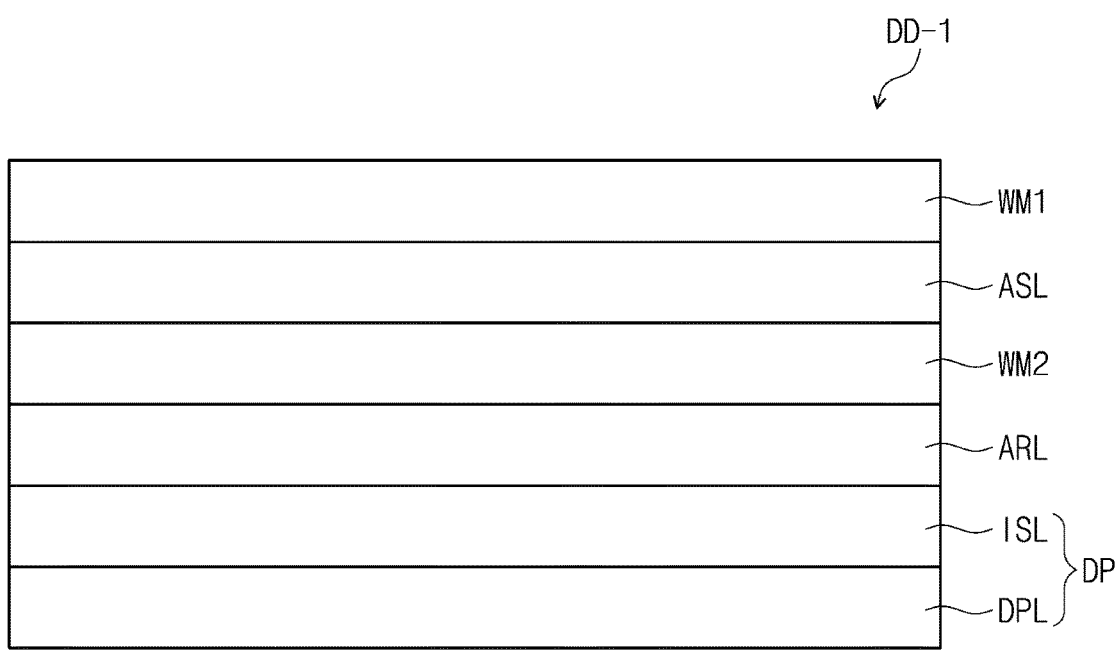
FIG. 3 is a diagram schematically illustrating a display device according to an embodiment of the inventive concept.

FIG. 3 is a diagram schematically illustrating a display device DD-1 according to an embodiment. A duplicate description of the same component as the component described with reference to FIG. 2 will be omitted.

Referring to FIG. 3, the display device DD-1 may include a display panel DP, an anti-reflection layer ARL, a second window WM2, an impact protection layer ASL, and a first window WM1. The display panel DP may include a display layer DPL and an input sensor layer ISL. That is, the display device DD-1 illustrated in FIG. 3 may have a structure in which a second window WM2 is added to the display device DD illustrated in FIG. 2.

The second window WM2 may be disposed between the anti-reflection layer ARL and the impact protection layer ASL. The second window WM2 and the anti-reflection layer ARL may be bonded to each other by an adhesive layer. The adhesive layer may be a pressure sensitive adhesive film (PSA) or an optically clear adhesive member (OCA).

The second window WM2 includes at least one base layer member. The base layer member may be a glass substrate or a synthetic resin film. The second window WM2 may have a multilayer structure. The second window WM2 may include a thin-film glass substrate and a synthetic resin film which is disposed on the thin-film glass substrate.

In an embodiment, the adhesive layer may be omitted, and the anti-reflection layer ARL may be directly disposed on the second window WM2. The anti-reflection layer ARL may be coated with an organic material, an inorganic material, or a ceramic material.

Figure 4:
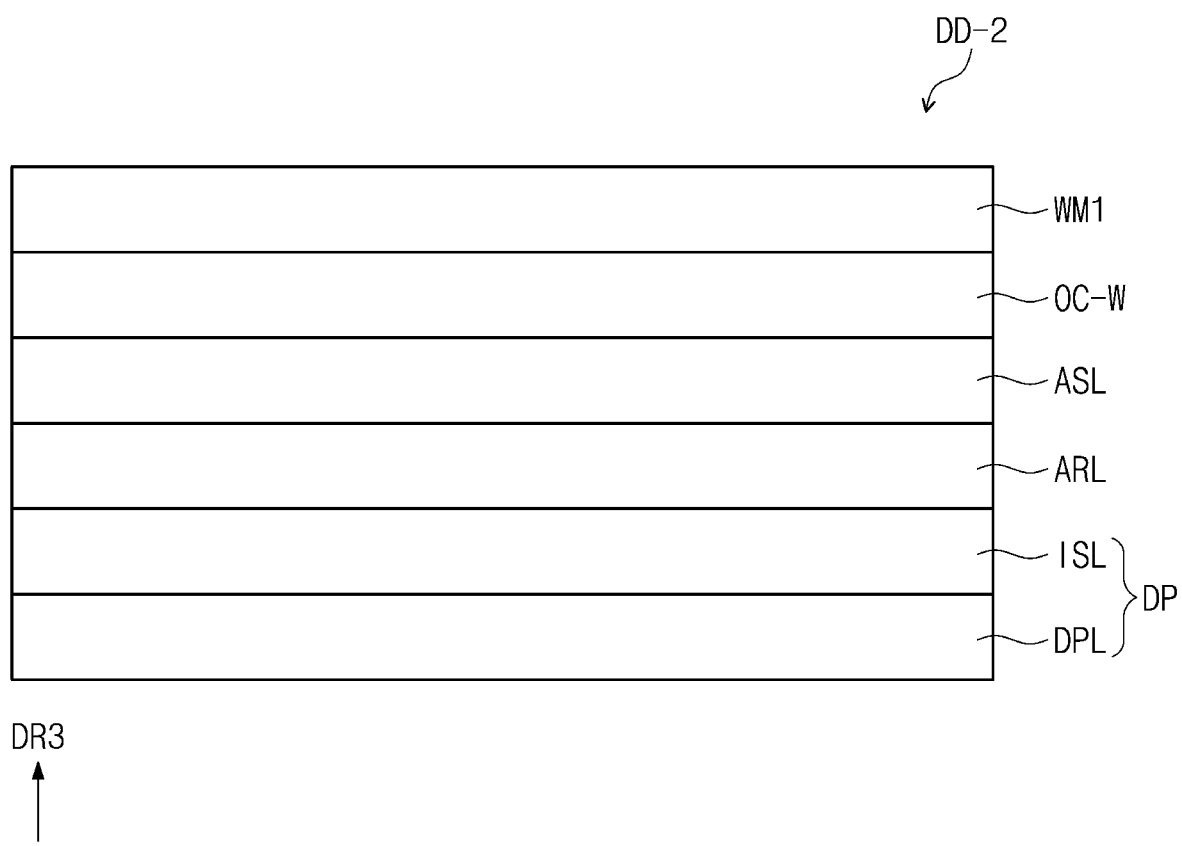
FIG. 4 is a diagram schematically illustrating a display device according to an embodiment of the inventive concept.

FIG. 4 is a diagram schematically illustrating a display device DD-2 according to an embodiment. A duplicate description of the same component as the component described with reference to FIG. 2 will be omitted.

Referring to FIG. 4, the display device DD-2 may include a display panel DP, an anti-reflection layer ARL, an impact protection layer ASL, a window overcoat layer OC-W, and a first window WM1. The display panel DP may include a display layer DPL and an input sensor layer ISL. That is, the display device DD-2 illustrated in FIG. 4 may have a structure in which a window overcoat layer OC-W is added to the display device DD illustrated in FIG. 2.

The window overcoat layer OC-W may be disposed between the impact protection layer ASL and the first window WM1. The impact protection layer ASL may include a plurality of spacers SP (see FIG. 6), and a material may be filled in the interspace GAP which is a space between the plurality of spacers SP. The window overcoat layer OC-W may cover the plurality of spacers SP and the interspace GAP. The window overcoat layer OC-W may include an organic material, and may provide a flat lower surface thereof which is closest to the display panel DP. In addition, the window overcoat layer OC-W may allow a better attachment of the first window WM1 including an inorganic material to the impact protection layer ASL.

Figure 5:
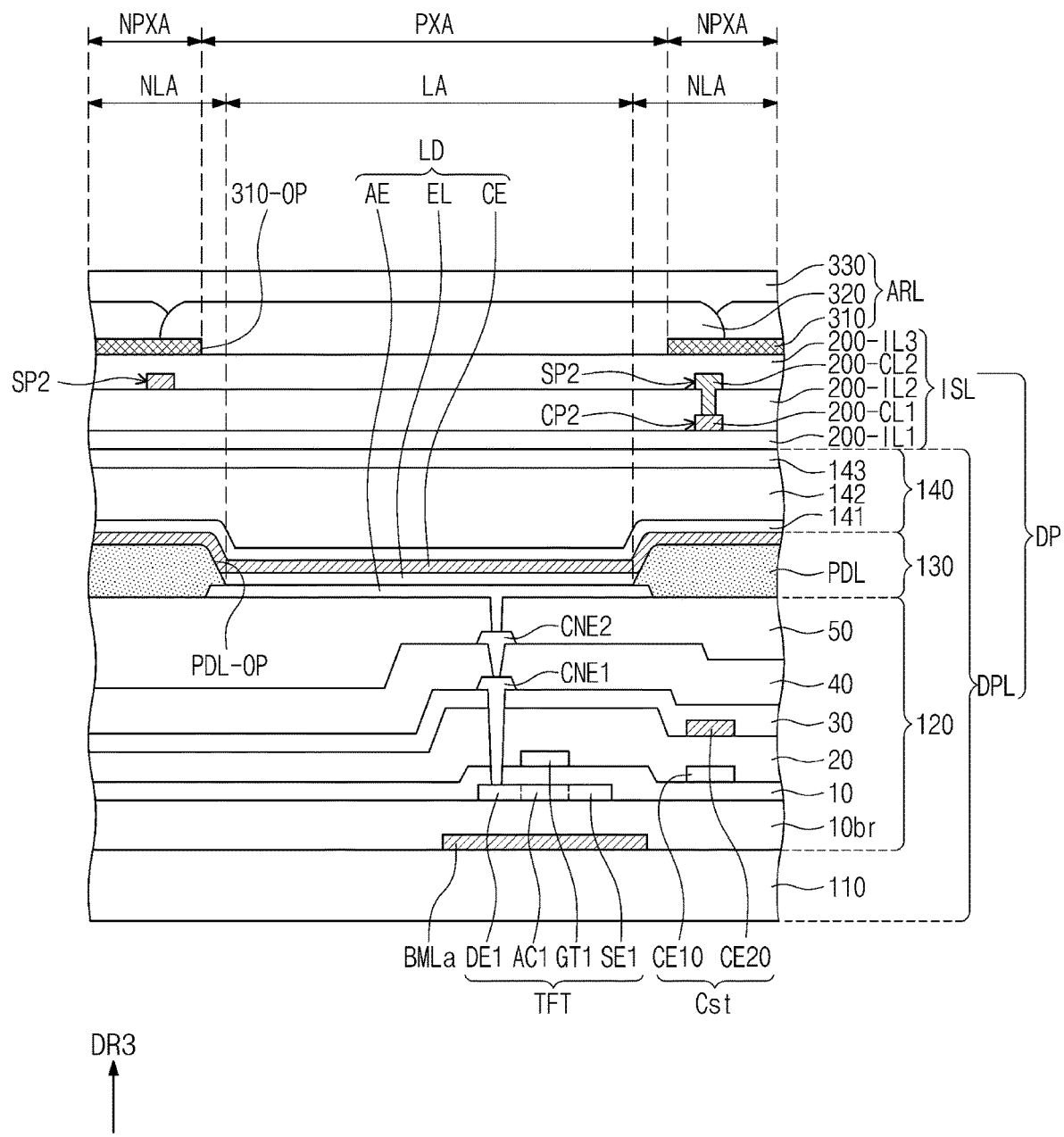
FIG. 5 is across-sectional view of a portion of a display device according to an embodiment.

FIG. 5 is a cross-sectional view of a portion of a display device DD (see FIG. 1) according to an embodiment. FIG. 5 is a cross-sectional view that illustrates, in the display device DD, a display layer DPL, an input sensor layer ISL, and an anti-reflection layer ARL.

FIG. 5 illustrates a cross-sectional view corresponding to one of a light-emitting region LA and a non-light-emitting region NLA which is adjacent to the light emitting region LA. Although only one light-emitting region LA is illustrated in FIG. 5, a plurality of light-emitting regions LA may be provided. FIG. 5 illustrates a light-emitting element LD and a transistor TFT which is connected thereto. The transistor TFT may be one of a plurality of transistors included in a driving circuit for a pixel. In this embodiment, the transistor TFT is described as a silicon transistor, but may also be a metal oxide transistor.

Referring to FIG. 5, the display panel DP may include a display layer DPL and an input sensor layer ISL. The display layer DPL may include a base layer 110, a circuit layer 120, a light-emitting element layer 130, and an encapsulation layer 140.

The base layer 110 may provide a base surface on which the circuit layer 120 is disposed. The base layer 110 may be a rigid substrate or a flexible substrate capable of bending, folding, rolling, or the like. The base layer 110 may be a glass substrate, a metal substrate, or a polymer substrate. However, the invention is not limited thereto, and the base layer 110 may include an inorganic layer, an organic layer, or a composite material layer.

The base layer 110 may have a multilayer structure. In an embodiment, for example, the base layer 110 may include a first synthetic resin layer, a multi- or single-layered inorganic layer, and a second synthetic resin layer which is disposed on the multi- or single-layered inorganic layer. Each of the first and second synthetic resin layers may include a polyimide-based resin, and is not particularly limited.

The circuit layer 120 may be disposed on the base layer 110. The circuit layer 120 may include an insulating layer, a semiconductor pattern, a conductive pattern, a signal line, a driving circuit for a pixel, and the like. The circuit layer 120 may include a buffer layer 10$br$ and first to fifth insulating layers 10, 20, 30, 40, and 50.

The buffer layer 10$br$ may be disposed on the base layer 110. The buffer layer 10$br$ may prevent (or reduce) metal atoms or impurities diffusing from the base layer 110 and into a semiconductor pattern thereabove. The semiconductor pattern includes an active region AC1 of the transistor TFT.

A rear metal layer BMLa may be disposed under the transistor TFT (e.g., closer to the base layer 110 than the transistor TFT), and may block external light from reaching the transistor TFT. The rear metal layer BMLa may be disposed between the base layer 110 and the buffer layer 10$br$. In an embodiment, an inorganic barrier layer may be further disposed between the rear metal layer BMLa and the buffer layer 10$br$. The rear metal layer BMLa may be connected to an electrode or a wiring, and may receive a constant voltage or a signal therefrom.

The semiconductor pattern may be disposed on the buffer layer 10$br$. The semiconductor pattern may include a silicon semiconductor. In an embodiment, for example, the silicon semiconductor may include amorphous silicon, polycrystalline silicon, or the like. In an embodiment, for example, the semiconductor pattern may include a low-temperature polysilicon.

The semiconductor pattern may include a first region having high conductivity and a second region having low conductivity. The first region may be doped with an N-type dopant or a P-type dopant. A P-type transistor may include a doped region doped with a P-type dopant, and an N-type transistor may include a doped region doped with an N-type dopant. The second region may be an undoped region, or a region including a doping concentration which is lower than a doping concentration of the first region.

The first region may have higher conductivity than the second region, and may substantially serve as an electrode or a signal line. The second region may substantially correspond to an active region AC1 (or channel) of the transistor TFT. In other words, a portion of the semiconductor pattern may be an active region AC1 of the transistor TFT, another portion may be a source or drain of the transistor TFT, and still another portion may be a connection electrode or a connection signal line.

The transistor TFT may include a source region SE1 (or a source), an active region AC1 (or a channel), a drain region DE1 (or a drain), and a gate GT1. The source region SE1, the active region AC1, and the drain region DE1 of the transistor TFT may be formed (or provided) from a semiconductor pattern. The source region SE1 and the drain region DE1 may extend in opposite directions, from the active region AC1, on a cross-section.

A first insulating layer 10 may be disposed on the buffer layer 10br. The first insulating layer 10 may overlap the plurality of pixels in common and cover the semiconductor pattern. The first insulating layer 10 may include an inorganic layer and/or an organic layer, and may have a single-layer or multilayer structure. The inorganic layer may include at least one of aluminum oxide, titanium oxide, silicon oxide, silicon nitride, silicon oxynitride, zirconium oxide, and hafnium oxide. In this embodiment, the first insulating layer 10 may be a single-layered silicon oxide layer. The insulating layer of the circuit layer 120 to be described later as well as the first insulating layer 10 may be an inorganic layer and/or an organic layer, and may have a single-layer or multilayer structure. The inorganic layer may include at least one of the above-described materials, but is not limited thereto.

The gate GT1 of the transistor TFT is disposed on the first insulating layer 10. The gate GT1 may be a part of a metal pattern or metal layer. The gate GT1 overlaps (or corresponds to) the active region AC1. In the process of doping the semiconductor pattern, the gate GT1 may function as a mask. The gate GT1 may include titanium (Ti), silver (Ag), Ag-containing alloy, molybdenum (Mo), Mo-containing alloy, aluminum (Al), Al-containing alloy, aluminum nitride (AlN), tungsten (W), tungsten nitride (WN), copper (Cu), indium tin oxide (ITO), indium zinc oxide (IZO), and the like, but the invention is not limited thereto.

A first capacitor electrode CE10 of a storage capacitor Cst may be disposed on the first insulating layer 10. A second insulating layer 20 may be disposed on the first insulating layer 10, and may cover the gate GT1 and the first capacitor electrode CE10 of the storage capacitor Cst. A second capacitor electrode CE20 of the storage capacitor Cst may be disposed on the second insulating layer 20. A third insulating layer 30 may be disposed on the second insulating layer 20 and may cover the second capacitor electrode CE20 of the storage capacitor Cst.

A first connection electrode CNE1 may be disposed on the third insulating layer 30. The first connection electrode CNE1 may be connected to the drain region DE1 of the transistor TFT, at or through a contact hole passing through the first to third insulating layers 10, 20, and 30.

A fourth insulating layer 40 may be disposed on the third insulating layer 30. The second connection electrode CNE2 may be disposed on the fourth insulating layer 40. The second connection electrode CNE2 may be connected to the first connection electrode CNE1, through a contact hole passing through the fourth insulating layer 40. A fifth insulating layer 50 may be disposed on the fourth insulating layer 40 and may cover the second connection electrode CNE2. The stacked structure of the first insulating layer 10 to the fifth insulating layer 50 is only an example, and additional conductive layers and insulating layers may be further disposed in addition to the first insulating layer 10 to the fifth insulating layer 50.

Each of the fourth insulating layer 40 and the fifth insulating layer 50 may be an organic material layer. In an embodiment, for example, the organic material layer may include a general-purpose polymer such as benzocyclobutene (BCB), polyimide, hexamethyldisiloxane (HMDSO), polymethylmethacrylate (PMMA) or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, and a blend or combination thereof The light-emitting element layer 130 may be disposed on the circuit layer 120. The light-emitting element layer 130 may include a light-emitting element LD and a pixel defining film PDL. The light-emitting element LD may include an organic light-emitting element, an inorganic light-emitting element, an organic-inorganic light-emitting element, a quantum dot light-emitting element, a micro LED light-emitting element, or a nano LED light-emitting element. However, the invention is not limited thereto, and the light-emitting element LD may include various embodiments as long as light may be generated or the amount of light may be controlled in response to an electrical signal.

The light-emitting element LD may include a first electrode AE (or pixel electrode), a light-emitting layer EL, and a second electrode CE (or common electrode). The first electrode AE may be disposed on the fifth insulating layer 50. The first electrode AE may be a (semi)transmissive electrode or a reflection electrode. The first electrode AE may include a reflection layer formed of Ag, Mg, Al, Pt, Pd, Au, Ni, Nd, Ir, Cr or a compound thereof and a transparent or translucent electrode layer formed on the reflection layer. The transparent or translucent electrode layer may include at least one selected from the group consisting of indium tin oxide (ITO), indium zinc oxide (IZO), indium gallium zinc oxide (IGZO), zinc oxide (ZnO) or indium oxide ($In_2O_3$), and aluminum doped zinc oxide (AZO). For example, the first electrode AE may include a stacked structure of ITO/Ag/ITO.

The pixel defining film PDL may be disposed on the fifth insulating layer 50. According to an embodiment, the pixel defining film PDL may have a light-absorbing property, and for example, the pixel defining film PDL may have a black color. The pixel defining film PDL may contain a black coloring agent. The black coloring agent may contain a black dye and a black pigment. The black coloring agent may contain carbon black, a metal such as chromium, or an oxide thereof. The pixel defining film PDL may correspond to a light blocking pattern having light shielding characteristics.

The pixel defining film PDL may cover a portion of the first electrode AE. In an embodiment, for example, an opening PDL-OP that exposes a portion of the first electrode AE to outside the pixel defining film PDL, may be defined in the pixel defining film PDL. The opening PDL-OP of the pixel defining film PDL may define the light-emitting region LA.

The pixel defining film PDL may increase a distance between the edge of the first electrode AE and the second electrode CE. Accordingly, the pixel defining film PDL may serve to prevent an (electrical) arc from occurring at the edge of the first electrode AE.

Although not illustrated, a hole control layer may be disposed between the first electrode AE and the light-emitting layer EL. The hole control layer may include a hole transport layer and may further include a hole injection layer. An electron control layer may be disposed between the light-emitting layer EL and the second electrode CE. The electron control layer may include an electron transport layer and may further include an electron injection layer.

The encapsulation layer 140 may be disposed on the light-emitting element layer 130. The encapsulation layer 140 may protect the light-emitting element layer 130 from foreign substances such as moisture, oxygen, and dust particles. The encapsulation layer 140 may include an inorganic layer 141, an organic layer 142, and an inorganic layer 143 that are sequentially stacked, but the layers constituting the encapsulation layer 140 are not limited thereto.

The inorganic layers 141 and 143 may protect the light-emitting element layer 130 from moisture and oxygen, and the organic layer 142 may protect the light-emitting element layer 130 from foreign substances such as dust particles. The inorganic layers 141 and 143 may include a silicon nitride layer, a silicon oxynitride layer, a silicon oxide layer, a titanium oxide layer, an aluminum oxide layer, or the like. The organic layer 142 may include an acryl-based organic layer, but the invention is not limited thereto.

The input sensor layer ISL may be disposed on the display layer DPL. The input sensor layer ISL may be referred to as a sensor layer, an input sensing layer, or an input sensing panel. The input sensor layer ISL may include a base layer 200-CL1, a first conductive layer 200-CL1, a sensing insulating layer 200-IL2, a second conductive layer 200-CL2, and a cover layer 200-IL3.

The base layer 200-IL1 may be directly disposed on the display layer DPL. The base layer 200-IL1 may be an inorganic layer including at least one of silicon nitride, silicon oxynitride, and silicon oxide. Alternatively, the base layer 200-IL1 may be an organic layer including an epoxy resin, an acryl resin, or an imide-based resin. The base layer 200-IL1 may have a single-layer structure or a multilayer structure in which layers are stacked along the third direction DR3.

Each of the first conductive layer 200-CL1 and the second conductive layer 200-CL2 may have a single-layer structure or a multilayer structure in which layers are stacked along the third direction DR3. Each of the first conductive layer 200-CL1 and the second conductive layer 200-CL2 may include a bridge pattern CP2 and a sensing pattern SP2, respectively, having a mesh structure.

A single-layered conductive layer may include a metal layer or a transparent conductive layer. The metal layer may include molybdenum, silver, titanium, copper, aluminum, or an alloy thereof. A transparent conductive layer may include a transparent conductive oxide such as indium tin oxide (ITO), indium zinc oxide (IZO), or indium zinc tin oxide (IZTO). In addition, the transparent conductive layer may include a conductive polymer such as PEDOT, metal nanowires, graphene, and the like.

A multilayered conductive layer may include metal layers which are sequentially stacked. The metal layers may have, for example, a three-layer structure of titanium/aluminum/titanium. The multilayered conductive layer may include at least one metal layer and at least one transparent conductive layer.

The sensing insulating layer 200-IL2 may be disposed between the first conductive layer 200-CL1 and the second conductive layer 200-CL2. The cover layer 200-IL3 may be disposed on the sensing insulating layer 200-IL2 and may cover the second conductive layer 200-CL2. The cover layer 200-IL3 may reduce or eliminate the probability of damage to the second conductive layer 200-CL2 in a subsequent process of providing layers of the display device DD in a method thereof. In an embodiment, the input sensor layer ISL may not include or may omit the cover layer 200-IL3.

The sensing insulating layer 200-IL2 and the cover layer 200-IL3 may each include an inorganic film. The inorganic film may include at least one of aluminum oxide, titanium oxide, silicon oxide, silicon nitride, silicon oxynitride, zirconium oxide, and hafnium oxide.

Alternatively, the sensing insulating layer 200-IL2 and the cover layer 200-IL3 may include an organic film. The organic film may include at least one of an epoxy-based resin, a urethane-based resin, a cellulose-based resin, a siloxane-based resin, a polyimide-based resin, a polyamide-based resin, and a perylene-based resin.

The anti-reflection layer ARL may be disposed on the input sensor layer ISL. The anti-reflection layer ARL may include a light shielding pattern 310, a color filter 320, and a planarization layer 330.

A material constituting the light shielding pattern 310 is not particularly limited as long as the material absorbs light. The light shielding pattern 310 has a black color, and in an embodiment, the light shielding pattern 310 may contain a black coloring agent. The black coloring agent may contain a black dye and a black pigment. The black coloring agent may contain carbon black, a metal such as chromium, or an oxide thereof.

The light shielding pattern 310 may overlap the bridge pattern CP2 and the sensing pattern SP2 on a plane.

The light shielding pattern 310 may prevent reflection of external light caused by the first conductive patterns 200-CL1 and the second conductive patterns 200-CL2. An opening 310-OP may be defined in the light shielding pattern 310. The opening 310-OP of the light shielding pattern 310 may overlap the first electrode AE and may have a larger area than the opening PDL-OP of the pixel defining film PDL. In an embodiment, a dimension of the opening 310-OP of the light shielding layer (e.g., the light shielding patterns 310), along the first direction DR1 or the second direction DR2, may be larger than a dimension of the opening PDL-OP of the pixel defining film PDL, along the same direction.

The opening 310-OP of the light shielding pattern 310 may define the pixel region PXA of a pixel. The pixel region PXA may be defined as a region in which light generated by the light emitting element LD is emitted to outside the display device DD, at the pixel. As dimensions or the area of the pixel region PXA increases, the luminance of an image IM may increase.

The color filter 320 may overlap at least the pixel region PXA. The color filter 320 may further overlap the non-pixel region NPXA of the pixel which is adjacent to the pixel region PXA. A portion of the color filter 320 may be disposed on the light shielding pattern 310. The color filter 320 may transmit light generated by the light-emitting element LD, and may block, among external light, light of some wavelength bands of light. Accordingly, the color filter 320 may reduce external light reflection by the first electrode AE or the second electrode CE.

The planarization layer 330 may cover the light shielding pattern 310 and the color filter 320. The planarization layer 330 may include an organic material, and provide a flat top surface.

Figure 6:
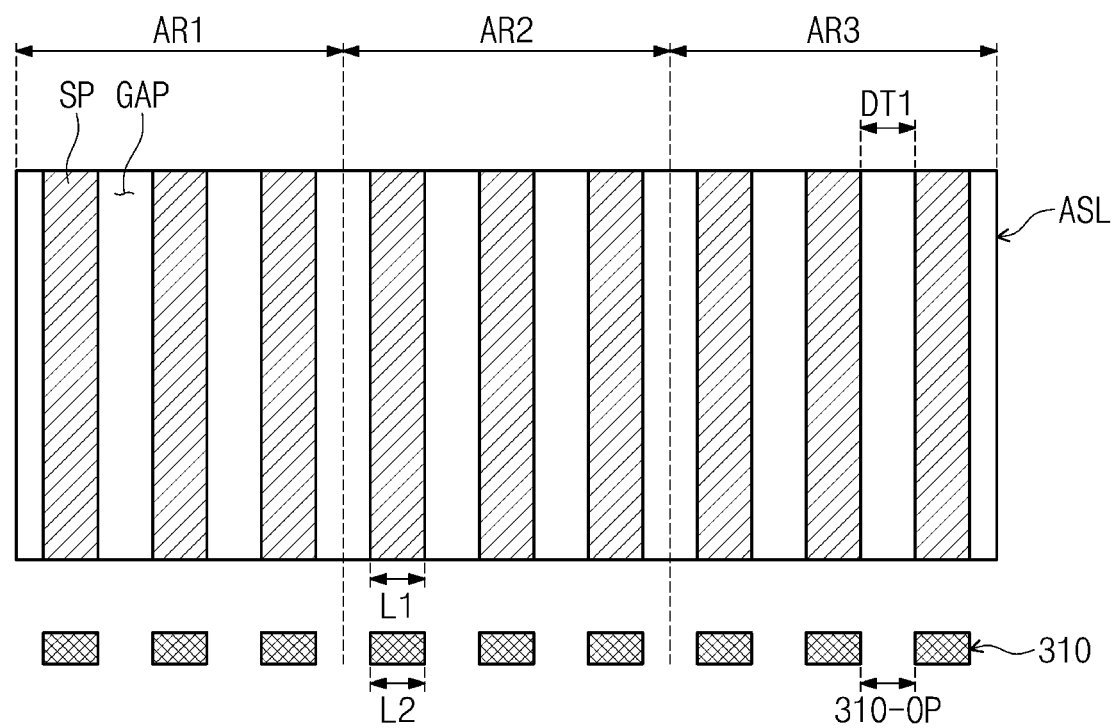
FIG. 6 is a diagram illustrating an impact protection layer and a light shielding pattern according to an embodiment of the inventive concept.

FIG. 6 is a diagram illustrating an impact protection layer ASL and a light shielding pattern 310 according to an embodiment. FIG. 6, shows the impact protection layer ASL relative to patterns (e.g., light shielding pattern 310) of the light shielding layer.

Referring to FIG. 6, the impact protection layer ASL may include a plurality of spacers SP and an interspace GAP. The plurality of spacers SP may be disposed to be spaced apart from each other with a first interval DT1 therebetween, in each of the first region AR1, the second region AR2, and the third region AR3. FIG. 6 illustrates that the plurality of spacers SP are spaced apart from each other at first intervals DT1 which are the same as each other, but is not particularly limited thereto. In an embodiment, for example, intervals between the plurality of spacers SP may not be the same. The intervals between the plurality of spacers SP may be adjusted according to the module structure of the display device DD (see FIG. 1A).

A region or space in which the plurality of spacers SP are not disposed may be defined as an interspace GAP. According to an embodiment, a material may be filled in the interspace GAP. The material may be a gas, a liquid crystal, an optically clear resin (OCR), or an organic material. The spacers SP may serve to form a space such that a gas or the like may be filled in the interspace GAP. Accordingly, the lengths (or heights) of the spacers SP in (or along) the third direction DR3 may be the same as the length (or thickness) of the impact protection layer ASL in (or along) the third direction DR3.

The plurality of spacers SP may be formed using an ultraviolet (UV) type resin, or may be formed through a photolithography method, and the spacers SP may include a photoresist material. The plurality of spacers SP may include an elastic material. The impact protection layer ASL including the spacers SP may serve as a cushion. When the display device DD (see FIG. 1A) receives an impact such as from a collision with an object, a time taken for an impact force to reach the lower surface of the impact protection layer ASL becomes longer due to the interspace GAP, and the impact force transferred to the lower portion of the impact protection layer ASL may be reduced or effectively alleviated. Accordingly, an impact applied to the display panel DP (see FIG. 2) may be reduced, and thus a bright spot defect of the display panel DP caused by the impact may be reduced or eliminated.

Each of the plurality of spacers SP may overlap the light shielding pattern 310 on a plane. The first interval DT1 that is a separation distance between the spacers SP may be greater than or equal to an interval between the openings 310-OP of the light shielding pattern 310. First widths L1 of the spacers SP in (or along) the first direction DRI may be less than or equal to a second width L2 of the light shielding pattern 310 in (or along) the first direction DR1. Since the spacers SP overlap a portion of the light shielding pattern 310, light transmitted through the color filter 320 (see FIG. 5) is not blocked by the spacers SP.

According to an embodiment, the plurality of spacers SP may be transparent. When the spacers SP are transparent, light transmitted through the color filter 320 may not be blocked even if they do not overlap the light shielding pattern 310.

Figure 7:
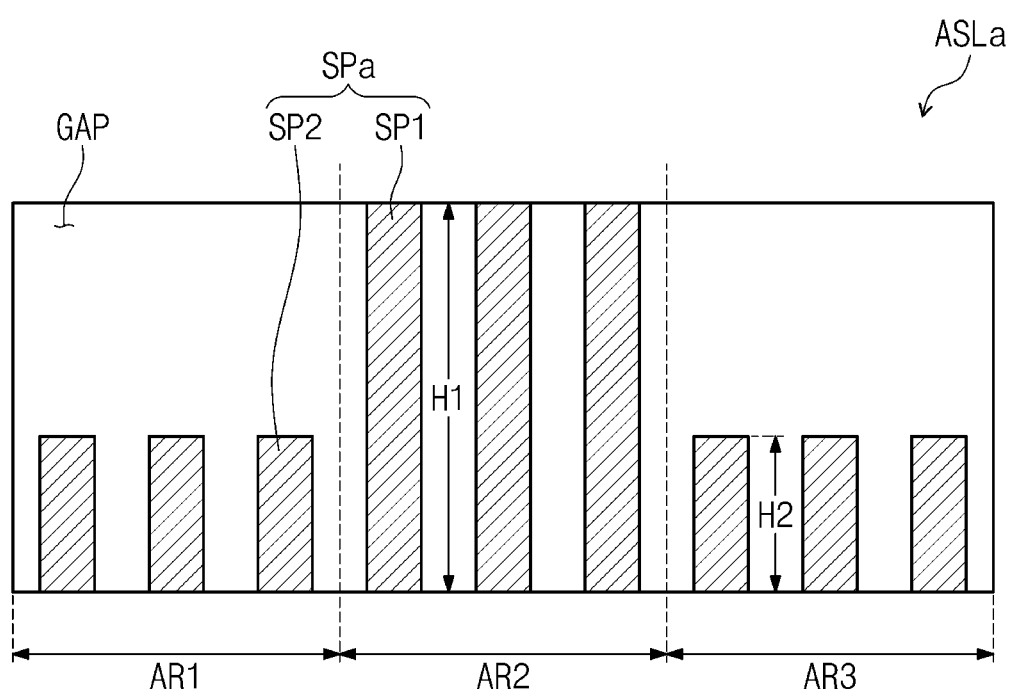
FIG. 7 is a diagram illustrating an impact protection layer according to an embodiment of the inventive concept.

FIG. 7 is a diagram illustrating an impact protection layer ASLa according to an embodiment. Referring to FIG. 7, the impact protection layer ASLa may include a plurality of spacers SPa and an interspace GAP. The plurality of spacers SPa may include a plurality of first spacers SP1 each having a first height H1, and a plurality of second spacers SP2 each having a second height H2 which is smaller than the first height H1. The first spacers SP1 may be referred to as main spacers, and the second spacers SP2 may be referred to as auxiliary spacers or sub spacers.

The plurality of first spacers SP1 may be disposed in the second region AR2 at which the display device DD and various components or layers thereof is foldable, and the plurality of second spacers SP2 may be disposed in the first region AR1 and the third region AR3. With respect to the thickness direction, lower members of the display panel DP may be disposed under the display panel DP (see FIG. 2) and further from the impact protection layer ASL than the display panel DP. Some of the lower members may be removed or have lower openings defined therein so as to secure the folding performance of the display device DD at the second region AR2. Accordingly, the second region AR2 may be more vulnerable to external impact than the first region AR1 and the third region AR3. According to an embodiment, when the first spacer SP1 having the larger height is disposed in the second region AR2, further reduction of transfer of an external impact to the second region AR2 of the display panel DP may be provided.

FIG. 7 illustrates that three first spacers SP1 are disposed in the second region AR2, and three second spacers SP2 are disposed in each of the first region AR1 and the third region AR3, but the invention is not limited thereto. The number of the plurality of first spacers SP1 and the number of the plurality of second spacers SP2 may vary according to the module structure of the display device DD (see FIG. 1).

A space in which the plurality of spacers SPa are not disposed may be defined as an interspace GAP. According to an embodiment, a material may be filled in the interspace GAP. The material may be a gas, a liquid crystal, an optically clear resin (OCR), or an organic material. The spacers SPa may serve to form a space such that a material is filled in the interspace GAP. Accordingly, the length of each of the spacers SPa in the third direction DR3 may be the same as the length of the impact protection layer ASL in the third direction DR3.

Figure 8:
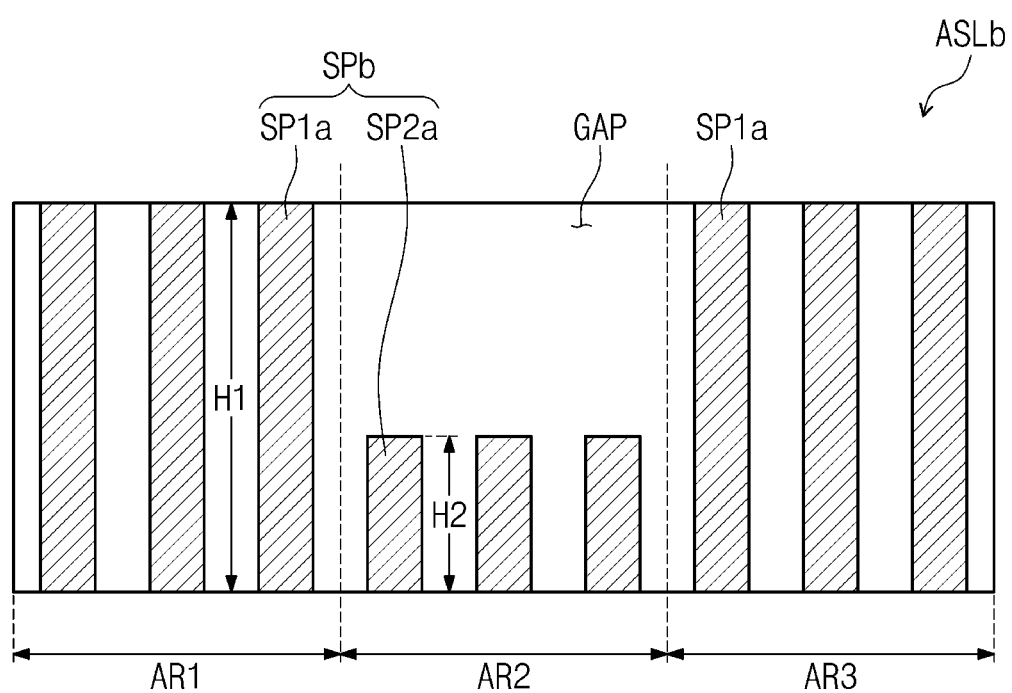
FIG. 8 is a diagram illustrating an impact protection layer according to an embodiment of the inventive concept.

FIG. 8 is a diagram illustrating an impact protection layer ASLb according to an embodiment.

Referring to FIG. 8, the impact protection layer ASLb may include a plurality of spacers SPb and an interspace GAP. The plurality of spacers SPb may include a plurality of first spacers SP1a each having a first height H1, and a plurality of second spacers SP2a each having a second height H2 which is smaller than the first height H1.

The plurality of second spacers SP2a may be disposed in the second region AR2, and the plurality of first spacers SP1a may be disposed in the first region AR1 and the third region AR3. Each of the spacers SPb has an area, such as a product of dimensions taken along the first direction DR1 and the second direction DR2, without being limited thereto. A density of the spacers SPb within the impact protection layer ASLb may be defined by a number thereof. Referring to FIG. 8, for example, as the first spacers SP1a have a larger area and density, rigidity against pressing or impact may become greater. The second spacers SP2a are disposed in the second region AR2, and therefore the bending strength of the impact protection layer ASL may be improved owing to less rigidity and a repulsive force during folding may be reduced.

The first region AR1 and the third region AR3 are each a non-folding region in which impact resistance and rigidity against pressing or the panel rigidity is increased. Accordingly, the first spacers SP1a having the same height first H1 as the thickness of the impact protection layer ASLb in the third direction DR3, may be disposed in the first region AR1 and the third region AR3, thereby firmly supporting the top surface of the impact protection layer ASLb.

The second region AR2 is a folding region in which bending strength is increased and repulsive force is decreased, during folding of the display device DD. However, the color filter 320 (see FIG. 5) disposed under the impact protection layer ASLb may be damaged during folding, and therefore providing the second spacers SP2a in the second region AR2 may prevent damage to the color filter 320 as compared to the case where there is no element in the second region AR2.

FIG. 8 illustrates that three second spacers SP2a are disposed in the second region AR2, and three first spacers SP1a are disposed in each of the first region AR1 and third region AR3, but the invention is not limited thereto. The number of the plurality of first spacers SP1a and the number of the plurality of second spacers SP2a may vary according to the module structure of the display device DD (see FIG. 1).

Figure 9:
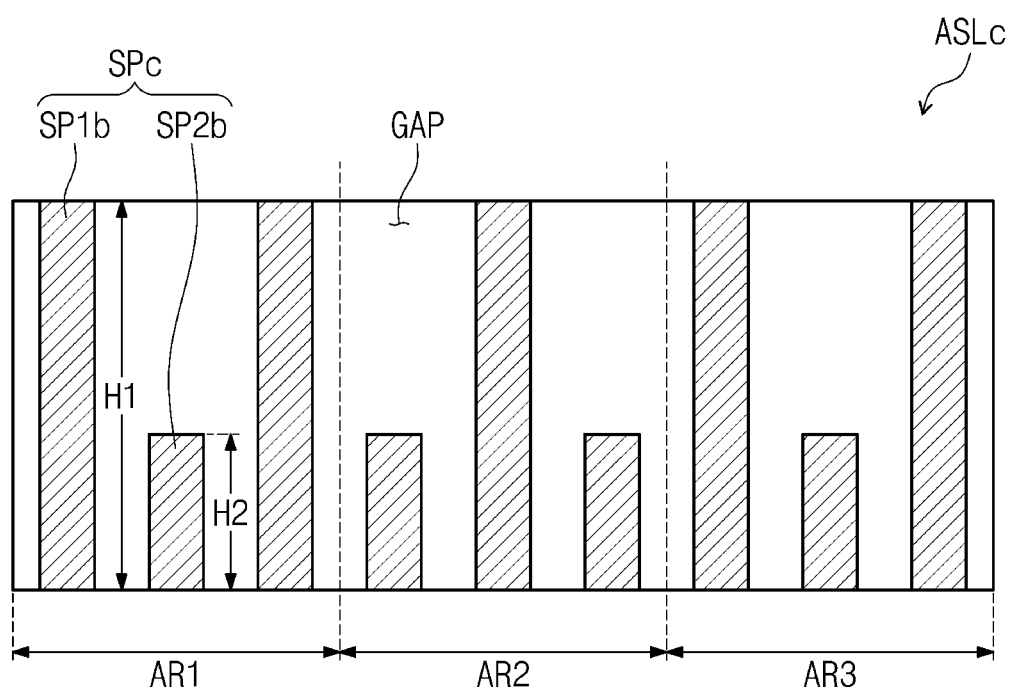
FIG. 9 is a diagram illustrating an impact protection layer according to an embodiment of the inventive concept.

FIG. 9 is a diagram illustrating an impact protection layer ASLc according to an embodiment.

Referring to FIG. 9, the impact protection layer ASLc may include a plurality of spacers SPc and an interspace GAP. The plurality of spacers SPc may include a plurality of first spacers SP1b each having a first height H1 and a plurality of second spacers SP2b each having a second height H2 which is smaller than the first height H1.

The plurality of first spacers SP1b and the plurality of second spacers SP2b may be disposed in each of the first region AR1, the second region AR2, and the third region AR3. As the first spacers SP1b have a larger area and density, the rigidity against pressing or impact may become greater. The second spacers SP2b are disposed in the second region AR2, and therefore the bending strength of the impact protection layer ASLc may be improved and a repulsive force during folding may be reduced.

The number of the plurality of first spacers SP1b and the number of the plurality of second spacers SP2b may be freely adjusted according to the purpose and characteristics of the display device DD (see FIG. 1). In an embodiment, for example, lower members of the display device DD may be disposed under the display panel DP (see FIG. 2), and some of the lower members may be removed or have lower openings therein so as to secure the folding performance of the second region AR2. In this case, a region in which the lower member is removed or the lower openings are provided may be more vulnerable to external impact than other regions. According to an embodiment, since the first spacers SP1b are disposed in the region in which the lower member is removed or the lower openings are provided, it is possible to further reduce transfer of an external impact to the region of the display panel DP. However, when the lower members are disposed under the display panel DP or a lower opening is not provided, a larger number of the second spacers SP2b than the first spacers SP1b may be provided to improve the bending strength of the impact protection layer ASLc and reduce the repulsive force during folding. FIG. 9 exemplarily illustrates that the plurality of first spacers SP1b and the plurality of second spacers SP2b are alternately arranged one by one, but is not particularly limited thereto.

Figure 10:
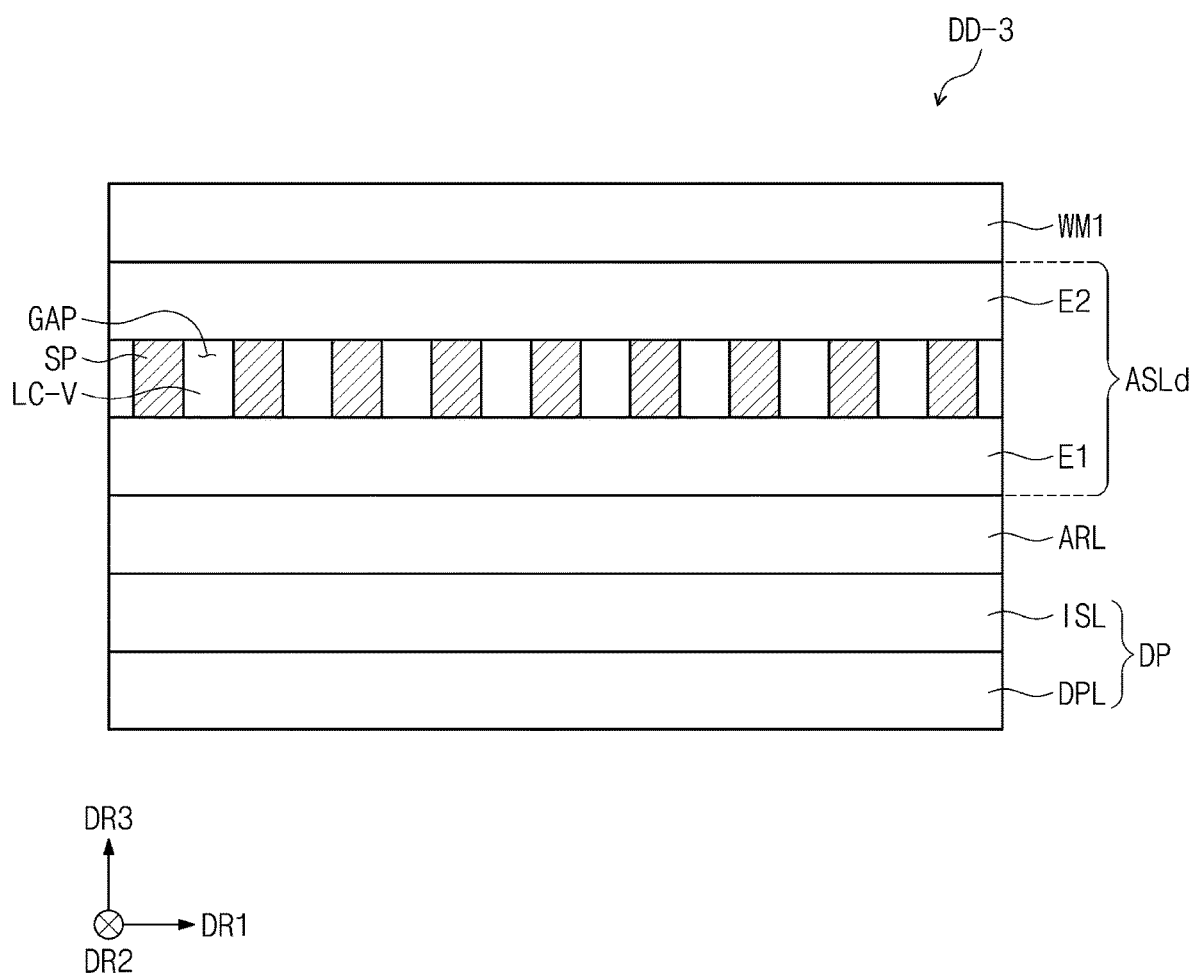
FIG. 10 is a cross-sectional view of a display device according to an embodiment.

FIG. 10 is a cross-sectional view of a display device DD-3 according to an embodiment. A duplicate description of the same component as the component described with reference to FIG. 2 will be omitted.

Referring to FIG. 10, an impact protection layer ASLd may further include a plurality of spacers SP, a liquid crystal LC-V filled between the plurality of spacers SP, a first liquid crystal electrode E1 and a second liquid crystal electrode E2. Although nine first spacers SP are exemplarily illustrated in FIG. 10, the types and number of spacers SP are not particularly limited thereto. The plurality of spacers SP may include first spacers SP1 (see FIG. 7) and second spacers SP2 (see FIG. 7).

The first liquid crystal electrode E1 may be disposed between the anti-reflection layer ARL and the liquid crystal LC-V, and between the plurality of spacers SP and the anti-reflection layer ARL. The second liquid crystal electrode E2 may be disposed between the liquid crystal LC-V and the first window WM1, and between the plurality of spacers SP and the first window WM1. The liquid crystal LC-V and the spacers SP may be disposed between the first liquid crystal electrode E1 and the second liquid crystal electrode E2.

The liquid crystal LC-V may include vertically aligned liquid crystal molecules and may have an arrangement direction changeable by an electric field. The arrangement direction of the liquid crystal molecules may be changed by the electric field formed between the first liquid crystal electrode E1 and the second liquid crystal electrode E2. In an embodiment, for example, between the first liquid crystal electrode E1 and the second liquid crystal electrode E2, the liquid crystal molecules may be vertically aligned when voltage is not applied, and may be horizontally aligned when voltage is applied.

When the liquid crystal molecules are vertically aligned, light incident from the outside may not pass through the liquid crystal LC-V. Accordingly, external light may not be reflected by the component included in the display device DD-3, resulting in improvement in blackness when the screen of the display device DD-3 is off. When the display device DD-3 displays an image IM, liquid crystal molecules may be horizontally arranged, and light provided from the display layer DPL may pass through the impact protection layer ASL to be provided to the outside.

The liquid crystal LC-V may be filled in the interspace GAP, in which the plurality of spacers SP are not disposed, such as by using an ODF method or an osmotic pressure method. The ODF method is a method involving a process of injecting and arranging liquid crystals by dropping liquid crystal particles on one glass of the panel in a vacuum state, and then covering the one glass with another glass to thereby spread out the liquid crystal.

FIG. 11 is a plan view of an impact protection layer ASL-1 according to an embodiment.

Referring to FIG. 11, the impact protection layer ASL-1 may further include a plurality of spacers SP and a sealant SLT.

The interspace GAP, in which the plurality of spacers SP are not disposed, may be defined in the impact protection layer ASL-1, and the interspace GAP may be filled with gas, liquid crystal, optically clear resin (OCR), or an organic material.

The sealant SLT may have a shape surrounding the interspace GAP, and may prevent a material filled in the interspace GAP from leaking out of the impact protection layer ASL-1.

FIG. 11 exemplarily illustrates twenty-six circular spacers SP, but the number and shape of the spacers SP are not particularly limited thereto. In an embodiment, for example, the number of spacers SP may vary according to the module structure of the display device DD (see FIG. 1), and the shape of the spacers SP may have various shapes, such as a diamond, a square, a polygon, a mesh, or a bar.

Figure 12A:
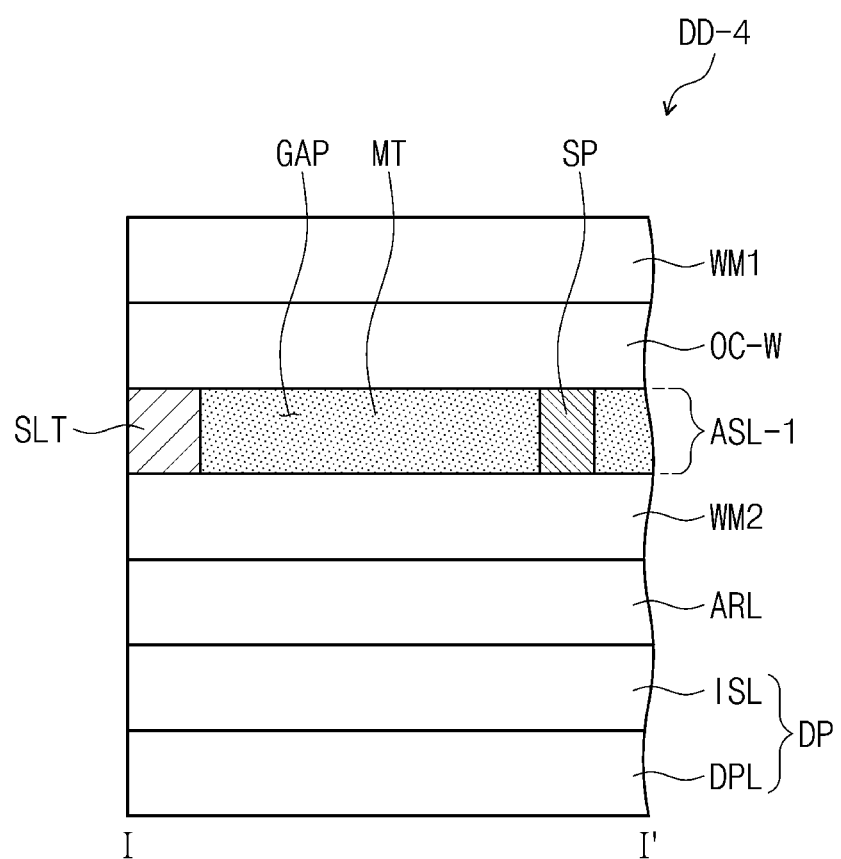
FIG. 12A is a cross-sectional view of a display device including a cross-section taken along line I-I' of FIG. 11.

FIG. 12A is a cross-sectional view, of a display device DD-4, corresponding to a cross-section taken along line I-I' of FIG. 11. A duplicate description of the same component as the component described with reference to FIG. 2 will be omitted.

Referring to FIGS. 11 and 12A, the display device DD-4 may include a display panel DP, an anti-reflection layer ARL, a second window WM2, an impact protection layer ASL-1, a window overcoat layer OC-W, and a first window WM1. The display panel DP may include a display layer DPL and an input sensor layer ISL. The impact protection layer ASL-1 may include the spacers SP, the sealant SLT, and a filling material MT disposed in the interspace GAP.

The sealant SLT may be provided to bond a component disposed on top of the impact protection layer ASL-1 and a component disposed under the impact protection layer ASL-1, to the impact protection layer ASL-1. In addition, the sealant SLT may define a space in which the filling material MT is provided. The filling material MT may be a gas, a liquid crystal, an optically clear resin (OCR), or an organic material.

The window overcoat layer OC-W may include the organic material, and a lower surface of the window overcoat layer OC-W may be provided with a flat surface. In addition, by the window overcoat layer OC-W may further improve the adhesion to the sealant SLT and the adhesion to a remaining portion of the impact protection layer ASL-1.

In an embodiment, an overcoat layer may be further disposed between the impact protection layer ASL-1 and the second window WM2. In addition, in an embodiment, the window overcoat layer OC-W may be omitted.

Figure 12B:
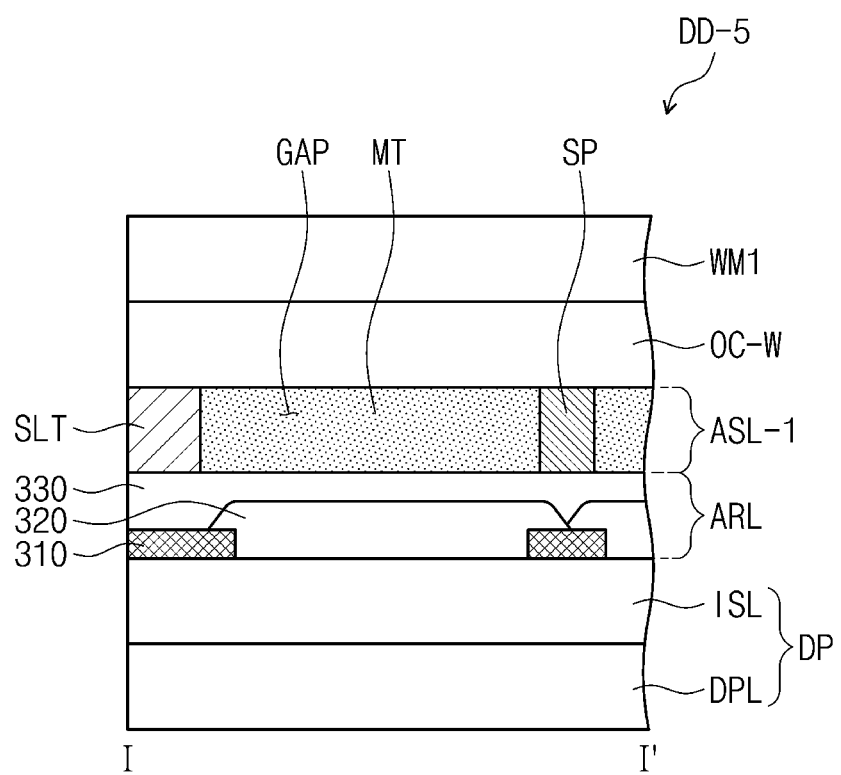
FIG. 12B is a cross-sectional view of a display device including a cross-section taken along line I-I' of FIG. 11.

FIG. 12B is a cross-sectional view, of a display device DD-5, corresponding to a cross-section taken along line I-I' of FIG. 11. A duplicate description of the same component as the component described with reference to FIG. 2 will be omitted.

Referring to FIGS. 11 and 12B, an anti-reflection layer ARL may be disposed on an input sensor layer ISL. The anti-reflection layer ARL may include a light shielding pattern 310, a color filter 320, and a planarization layer 330.

The light shielding pattern 310 may be formed of a material that absorbs light, and may prevent reflection of external light. A portion of the color filter 320 may be disposed on the light shielding pattern 310. The color filter 320 may transmit light generated by the light-emitting element LD (see FIG. 5), and block, among external light, light of some wavelength bands. The planarization layer 330 may cover the light shielding pattern 310 and the color filter 320. The planarization layer 330 may include an organic material, and provide a flat top surface.

The impact protection layer ASL-1 may be disposed on the planarization layer 330. The impact protection layer ASL-1 may include a spacer SP, a sealant SLT, and a filling material MT disposed in the interspace GAP. The spacer SP may be directly disposed on the planarization layer 330. The interspace GAP in which the plurality of spacers SP are not disposed may be defined in the impact protection layer ASL-1, and the interspace GAP may be filled with gas, liquid crystal, optically clear resin (OCR), or an organic material.

The sealant SLT may serve not only as an adhesive for allowing the window overcoat layer OC-W to be well attached to the impact protection layer ASL-1, but may also serve as a partition wall for retaining the filling material MT within the impact protection layer ASL-1.

The window overcoat layer OC-W may cover the plurality of the spacers SP and the interspace GAP. The window overcoat layer OC-W may include an organic material, and may provide a flat lower surface thereof. In addition, the window overcoat layer OC-W may allow the first window WM1 including an inorganic material to be attached better to the impact protection layer ASL-1.

According to an embodiment, an impact protection layer ASL including spacers SP may serve as a cushion within a display device DD. When an impact is applied to the display device DD, a force which is from the impact and transferred to the lower portion of the impact protection layer ASL may be alleviated by an interspace GAP provided in the impact protection layer ASL. Accordingly, it is possible to reduce the impact applied to the display panel DP disposed under the impact protection layer ASL, thereby reducing or eliminating bright spot defects of the display panel DP caused by the impact.

In addition, the spacers SP may include first spacers SP1 and second spacers SP2 which have different heights. As the first spacers SP1 have a larger area and density, the rigidity against pressing or impact may become greater. When the second spacers SP2 are disposed in a folding region, the bending strength of the impact protection layer ASL may be improved, and a repulsive force during folding may be reduced.

Although the embodiments of the invention have been described, it is understood that the invention should not be limited to these embodiments but various changes and modifications can be made by one ordinary skilled in the art within the spirit and scope of the invention as hereinafter claimed.

What is claimed is:

1. A display device comprising:
   a display panel including:
   a light-emitting region, and
   a display layer within the light-emitting region, the display layer comprising a light-emitting layer connected to a circuit layer; and
   in order from the display layer of the display panel:
   an anti-reflection layer comprising a color filter corresponding to the light-emitting region of the display panel;
   an impact protection layer comprising a plurality of spacers which do not overlap the light-emitting region; and
   a first window,
   wherein the impact protection layer further comprises a first surface closest to the display layer of the display panel and a second surface which is opposite to the first surface and closest to the first window, and
   among the plurality of spacers which do not overlap the light-emitting region:
   a plurality of first spacers extend from the first surface along a thickness direction of the impact protection layer and contact the second surface, and
   a plurality of second spacers extend from the first surface along the thickness direction of the impact protection layer and are spaced apart from the second surface.

2. The display device of claim 1, wherein within the impact protection layer, the plurality of spacers comprise:
   the plurality of first spacers each having a first height, and
   the plurality of second spacers each having a second height smaller than the first height.

3. The display device of claim 2, wherein a first region, a second region adjacent to the first region and folded, and a third region adjacent to the second region are defined along a first direction.

4. The display device of claim 3, wherein the plurality of first spacers are disposed in the second region, and the plurality of second spacers are disposed in the first region and the third region.

5. The display device of claim 3, wherein the plurality of second spacers are disposed in the second region, and the plurality of first spacers are disposed in the first region and the third region.

6. The display device of claim 3, wherein the plurality of first spacers and the plurality of second spacers are disposed in the first region, the second region, and the third region.

7. The display device of claim 3, wherein the plurality of first spacers and the plurality of second spacers are alternately arranged one by one.

8. The display device of claim 1, wherein the anti-reflection layer further comprises a light shielding pattern adjacent to the color filter.

9. The display device of claim 8, wherein the plurality of spacers of the impact protection layer correspond to the light shielding pattern of the anti-reflection layer.

10. The display device of claim 1, wherein the plurality of spacers within the impact protection layer are transparent.

11. The display device of claim 1, wherein each of the plurality of first spacers and each of the plurality of second spacers within the impact protection layer comprise an elastic material.

12. The display device of claim 1, wherein the impact protection layer further comprises:
the plurality of spacers spaced apart from each other with a space therebetween, and
a gas which fills the space between the plurality of spacers.

13. The display device of claim 1, wherein the impact protection layer further comprises:
the plurality of spacers spaced apart from each other with a space therebetween, and
a liquid crystal which fills the space between the plurality of spacers.

14. The display device of claim 13, wherein the impact protection layer further comprises:
a first liquid crystal electrode between the anti-reflection layer and the liquid crystal, and between the anti-reflection layer and the plurality of spacers,
a second liquid crystal electrode between the liquid crystal and the first window, and between the plurality of spacers and the first window,
the first liquid crystal electrode and the second liquid crystal electrode forming an electric field therebetween, and
the liquid crystal having an arrangement direction changeable by the electric field between the first liquid crystal electrode and the second liquid crystal electrode.

15. The display device of claim 1, further comprising a second window between the anti-reflection layer and the impact protection layer.

16. The display device of claim 1, wherein
the anti-reflection layer further comprises:
a light shielding pattern adjacent to the color filter, and
an overcoat layer covering the color filter and the light shielding pattern, and
the plurality of spacers of the impact protection layer are in direct contact with the overcoat layer of the anti-reflection layer.

17. The display device of claim 1, further comprising an overcoat layer disposed under the first window.

18. A display device comprising:
a display panel in which a plurality of light-emitting regions are defined, the light-emitting regions including a display layer comprising a light-emitting layer connected to a circuit layer;
an anti-reflection layer disposed on the display panel, the anti-reflection layer including:
a black matrix that does not overlap the plurality of light-emitting regions, and
a color filter corresponding to the light-emitting regions of the display panel;
a window disposed on the anti-reflection layer; and
an impact protection layer comprising:
a plurality of spacers which are disposed between the window and the color filter of the anti-reflection layer and do not overlap the light-emitting regions,
a first surface closest to the display layer of the display panel and a second surface which is opposite to the first surface and closest to the window, and
among the plurality of spacers which do not overlap the light-emitting regions:
a plurality of first spacers extend from the first surface along a thickness direction of the impact protection layer and contact the second surface, and
a plurality of second spacers extend from the first surface along the thickness direction of the impact protection layer and are spaced apart from the second surface.

19. The display device of claim 18, wherein the plurality of spacers are spaced apart from each other, and air is filled between the plurality of spacers.

20. The display device of claim 18, further comprising a liquid crystal disposed between the window and the anti-reflection layer and disposed between the plurality of spacers.

* * * * *